US 6,656,368 B2

United States Patent
Schoefthaler et al.

(10) Patent No.: US 6,656,368 B2
(45) Date of Patent: *Dec. 2, 2003

(54) NONSTICK LAYER FOR A MICROMECHANICAL COMPONENT

(75) Inventors: Martin Schoefthaler, Reutlingen (DE); Peter Hein, Reutlingen (DE); Helmut Skapa, Reutlingen (DE); Horst Muenzel, Reutlingen (DE)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/445,374

(22) PCT Filed: Apr. 17, 1998

(86) PCT No.: PCT/DE98/01075

§ 371 (c)(1),
(2), (4) Date: Mar. 2, 2000

(87) PCT Pub. No.: WO98/55876

PCT Pub. Date: Dec. 10, 1998

(65) Prior Publication Data

US 2003/0139040 A1 Jul. 24, 2003

(30) Foreign Application Priority Data

Jun. 6, 1997 (DE) .......................... 197 23 766

(51) Int. Cl.$^7$ .................... H01L 21/00; C23F 1/00
(52) U.S. Cl. .................. 216/2; 216/33; 216/35; 216/99; 251/129.06; 347/85

(58) Field of Search .................. 216/33, 35, 99, 216/2; 251/129.06; 347/85

(56) References Cited

U.S. PATENT DOCUMENTS

| 5,013,693 A | * | 5/1991 | Guckel et al. ............... 437/248 |
| 5,025,346 A | | 6/1991 | Howe et al. ............. 361/283.1 |
| 5,029,805 A | * | 7/1991 | Albarda et al. ................ 251/11 |
| 5,259,247 A | | 11/1993 | Bantien ........................ 73/718 |
| 5,403,665 A | | 4/1995 | Alley et al. ................. 428/447 |
| 5,512,374 A | | 4/1996 | Henck et al. ............... 428/422 |
| 5,838,351 A | * | 11/1998 | Weber .......................... 347/85 |
| 5,971,355 A | * | 10/1999 | Biegelsen et al. ..... 251/129.06 |

FOREIGN PATENT DOCUMENTS

DE 195 30 736 8/1996

OTHER PUBLICATIONS

Tsugai et al., "Airbag Accelerometer with Simple Switched--Capacitor readout ASIC" SPIE–the international society for optical engineering, vol.3224, Sep. 1997, pp. 74–78.*

* cited by examiner

Primary Examiner—Robert Kunemund
Assistant Examiner—Shamim Ahmed
(74) Attorney, Agent, or Firm—Kenyon & Kenyon

(57) ABSTRACT

A method for manufacturing micromechanical components, and a micromechanical component, in which a movable element is produced on a sacrificial layer. In a subsequent step the sacrificial layer beneath the movable element is removed so that the movable element becomes movable. After removal of the sacrificial layer, a protective layer is deposited on a surface of the movable element. Silicon oxide and/or silicon nitride is used for the protective layer.

7 Claims, 1 Drawing Sheet

NONSTICK LAYER FOR A MICROMECHANICAL COMPONENT

BACKGROUND OF THE INVENTION

Background information German Patent No. 19 530 736 describes a micromechanical acceleration sensor, and a method for manufacturing that acceleration sensor, in which a movable element is produced on a sacrificial layer, and the sacrificial layer beneath the movable element is removed in a subsequent step. The movable element is joined by deflection springs to joining regions, the sacrificial layer beneath the joining regions not being removed. The joining regions are thus joined immovably to a substrate. No features are disclosed with which adhesion of the movable elements is reduced.

SUMMARY OF THE INVENTION

The method and the micromechanical component according to the present invention have, in contrast, the advantage that because of the superficial protective layer, the adhesion tendency of the movable elements is reduced. It is therefore possible for the movable elements to be deflected by large forces to such an extent that they come into contact with other movable elements or with rigid elements, with no risk that the movable elements will thereby stick to one another or to the rigid elements. The operating reliability of the micromechanical components is improved by this feature. In addition, the structures thus formed can more easily be manipulated during manufacture, since there is no risk of adhesion.

The component itself is advantageously constituted from silicon, since this material exhibits very good mechanical properties and can very easily be patterned. A sacrificial layer of silicon oxide can be very easily etched, and silicon as a substrate material exhibits a very low coefficient of thermal expansion, which moreover is optimally adapted to the coefficient of expansion of a movable element made of silicon. Production of the protective layer is accomplished particularly easily by chemical vapor deposition or plasma-enhanced chemical vapor deposition.

DETAILED DESCRIPTION

Figure 1:
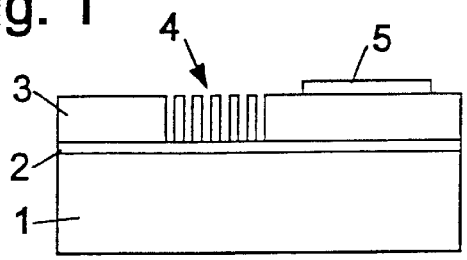
FIG. 1 shows a first part of the manufacturing method.

FIG. 1 shows a plate-shaped silicon substrate on which a sacrificial layer 2 of silicon oxide is applied. A further silicon layer 3 is applied on sacrificial layer 2 made of silicon oxide. An etching step is used to pattern out of the upper silicon layer 3 a movable element 4 that, in FIG. 1, is still attached to sacrificial layer 2. Also depicted is a metallization layer 5, for example made of aluminum, that is applied on the upper side of silicon layer 3.

Figure 2:
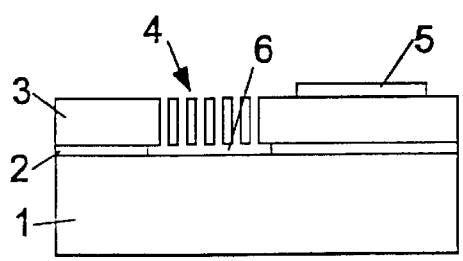
FIG. 2 shows a second part of the manufacturing method.

It is important here that a movable element 4 is arranged on a sacrificial layer 2. Movable element 4 is movable in the sense that after the removal of sacrificial layer 2 (which is depicted in FIG. 2), it is movable relative to the remainder of the micromechanical component. This is achieved by the fact that the movable structures are of very long and slender configuration in one direction, so that they can be bent by the application of force. Movable structures of this kind are depicted only schematically in FIG. 1. Examples include acceleration sensors such as those known, for example, from German Patent No. 195 30 736.

Instead of a silicon substrate 1, a sacrificial layer 2 made of silicon oxide, and an upper silicon layer 3 out of which movable element 4 is patterned, it is also possible to use other materials. For example, instead of a silicon substrate 1, a ceramic substrate or a metal substrate can be used. Instead of silicon oxide, other layers, for example glasses or metals or other ceramic materials, can also be utilized as sacrificial layer 2. Instead of an upper silicon layer 3, it is also possible to use a different layer, for example metal. Movable elements 4 are then produced not by etching but by electroplating deposition. The preferred exemplary embodiment is based, however, on a silicon substrate 1, a sacrificial layer 2 made of silicon oxide, and an upper silicon layer 3 for movable structure 4. With a material composition of this kind for the individual layers 1, 2, 3, a metallization 5 made of aluminum is then preferably used. It is important, however, that the movable elements are relatively small, so that adhesive forces are relatively large compared to the forces necessary in order to move the movable structures. If such is the case, the functionality of the micromechanical component is jeopardized if the movable elements touch one another or touch the remainder of upper silicon layer 3. Such touching can occur if the forces in the direction in which movable elements 4 are easily movable become greater than provided for in normal operation of the micromechanical element. This can be the case, for example, if large accelerations suddenly occur. Large accelerations of this kind occur, for example, if a micromechanical component falls, during manufacture, from a table approximately 1 meter high onto a concrete floor. If movable elements 4 then touch one another or substrate 1 or the remainder of upper silicon layer 3, the adhesion forces in that context can become so great that the return force of the deflected movable elements 4 is no longer sufficient to overcome that adhesion force. Movable elements 4 then become stuck to one another or to substrate 1 or to the remainder of upper silicon layer 3. In addition to the occurrence of large accelerations, very large, deflections of movable elements can also occur if electrical voltage differences are applied between movable elements 4 or to substrate 1 or to upper layer 3. The electrostatic attraction is relatively large for small structures, so that here again forces are generated that can result in impermissibly large deflections of movable elements 4. In this case as well, movable elements 4 can become stuck.

FIG. 2 shows a further manufacturing step in which sacrificial layer 2 beneath movable structures 4 is removed. Removal of sacrificial layer 2 is accomplished, for example, by way of an etching process using a hydrofluoric acid solution or a hydrofluoric acid vapor. Proceeding from FIG. 2, it is then proposed to apply onto the surface at least of movable elements 4 a protective layer that is suitable for reducing the adhesion forces. This is depicted in FIG. 3.

Figure 3:
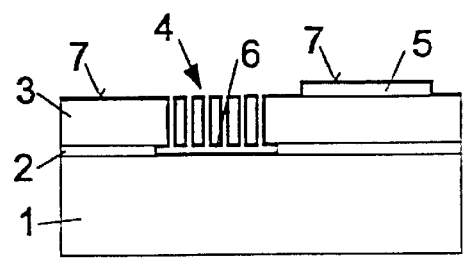
FIG. 3 shows a third part of the manufacturing method.

FIG. 3 shows a further manufacturing step for the micromechanical component after application of a protective layer 7. As is evident, protective layer 7 covers not only movable elements 4, but also the surface of silicon layer 3 and the surface of silicon substrate 1 that is arranged beneath movable elements 4. The material for protective layer 7 is, for example, silicon oxide or silicon nitride, the layer thickness being in the range from a few nanometers to a few hundred nanometers. Because this layer thickness is small, protective layer 7 also has no appreciable mechanical influence on movable elements 4. The known methods for depositing silicon oxide or silicon nitride layers are possible for producing protective layer 7. Possibilities are, first of all, chemical vapor deposition (CVD) or plasma enhanced chemical vapor deposition (PECVD). The advantage of these methods is principally that they make possible deposition even in cavity 6 that is located between movable structures 4 and substrate 1. The underside and the side walls of movable elements 4 are then, of course, also included in this protective layer 7. It has now been found, surprisingly, that by using thin silicon oxide layers or silicon nitride layers of this kind, the problem of the adhesion of movable microstructures is greatly alleviated. Also advantageous in this context is the fact that these layers can be produced with very good reproducibility in ordinary facilities.

Alternatively, it is also possible to use protective layers other than silicon nitride or silicon oxide. Metal oxides, metal nitrides, organic coatings, or the like are, for example, also conceivable. In addition, the protective layer can also be formed by converting the material of the microstructure, in the case of silicon microstructures or metallic microstructures, for example by oxidation. The microstructure shown schematically in FIG. 3 also has, in addition to movable structure 4, stationary regions that are formed by layer 3. The protective layers can be applied on the movable elements, on the stationary parts, or—as shown in FIG. 3—everywhere. To prevent adhesion, it is sufficient if the protective layers are applied only on the contact surfaces that can touch one another. In FIG. 3 the critical contact surfaces comprise, for example, the side walls of the movable structure and the side walls of the stationary layer 3 that are perpendicular to the substrate.

Figure 4:
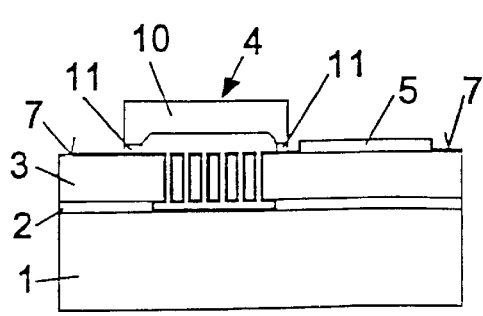
FIG. 4 shows a cross-sectional view of a completed micromechanical component.

By applying a protective cap 10, movable elements 4 can then be encapsulated hermetically from the environment. This is shown in FIG. 4. Protective cap 10 is joined by joining layers 11, which for example are made of a glass solder, adhesive, or the like, to the upper side of silicon layer 3 or to protective layer 7 applied thereonto. In order to ensure contacting to metallization 5, protective layer 7 applied thereonto has been removed by way of a further process step, for example an etching step.

Figure 5:
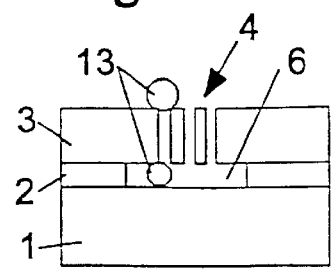
FIG. 5 shows the influence of dirt particles on insulation of the micromechanical element.

In addition to decreasing adhesion, the applied protective layer 7 also has a further advantage. This advantage is explained with reference to FIG. 5, which once again shows a cross section through a micromechanical component having a lower silicon layer 1, a sacrificial layer 2, and an upper silicon layer 3. Once again, a movable element 4 is patterned out of upper silicon layer 3, sacrificial layer 2 being removed beneath movable element 4. Also shown are dirt particles 13, one of these dirt particles being located in cavity 6 beneath movable elements 4, and one dirt particle 13 on the upper side of silicon layer 3 in such a way that it also touches movable element 4. As depicted in FIGS. 3 and 4, here as well the entire surface is covered with a thin film of silicon oxide or silicon nitride that, for reasons of simplification, is not depicted in FIG. 5. In micromechanical components, forces can be generated by the fact that electrical voltages are applied between individual parts of the micromechanical component. For that purpose, movable structure 4 can, for example, be electrically insulated from the remainder of upper silicon layer 3. If a dirt particle is then arranged between movable element 4 and the remainder of silicon layer 3, as shown in FIG. 5, a short circuit can occur between these two regions, so that the regions are no longer insulated from one another. This then, of course, complicates the controlled generation of electrostatic forces. In addition, different voltages can also be applied to movable element 4 in order to measure a signal, for example by measuring the capacitance between movable element 4 and stationary elements that are patterned out of upper silicon layer 3. This type of measurement is also impeded by a short circuit. Since the protective layers made of silicon oxide and silicon nitride also represent good electrical insulators, electrical insulation is thus maintained even if dirt particles are present. This is also true, of course, if electrical voltage differences exist between upper silicon layer 3 and lower silicon layer 1. Here as well, the superficial insulating protective layer of silicon oxide or silicon nitride acts as an insulator, so that even the dirt particle in cavity 6 shown in FIG. 5 does not cause any electrical short circuit between upper silicon layer 3 and lower silicon layer 1. In addition to reducing adhesion, the protective layers made of silicon oxide and silicon nitride thus also yield an improvement in the insulation of the individual elements of the micromechanical component.

What is claimed is:

1. A method for manufacturing a micromechanical component, comprising:
    producing, on a sacrificial layer, a movable element by patterning an upper layer;
    producing a metallization layer on the upper layer, wherein the metallization layer is not applied to the sacrificial layer;
    removing a portion of the sacrificial layer beneath the moveable element, so that the movable element becomes movable;
    subsequent to removing the portion of the sacrificial layer, producing a protective layer on the movable element and the metallization layer, wherein an adhesive force of the movable element is reduced by the protective layer; and
    removing the protective layer from the metallization layer.

2. The method according to claim 1, further comprising:
    producing the protective layer on a surface of a stationary element.

3. The method according to claim 1, wherein the protective layer includes at least one of silicon oxide and silicon nitride.

4. The method according to claim 1, wherein the sacrificial layer comprises silicon oxide and is arranged on a silicon substrate.

5. The method according to claim 1, wherein the removing of the sacrificial layer is accomplished by etching with hydrofluoric acid.

6. The method according to claim 1, further comprising:
    joining a cap to at least one of the protective layer and the upper layer, wherein the cap encapsulates the movable element.

7. The method according to claim 1, wherein the producing of the protective layer is accomplished by at least one of a chemical vapor deposition out of a gas phase, a plasma-enhanced chemical vapor deposition out of a gas phase, and oxidation.

* * * * *